US009647180B2

(12) United States Patent
Heo et al.

(10) Patent No.: US 9,647,180 B2
(45) Date of Patent: May 9, 2017

(54) GLASS-PHOSPHOR COMPOSITE CONTAINING RARE-EARTH ION AND LIGHT-EMITTING DIODE INCLUDING SAME

(71) Applicants: Seoul Viosys Co., Ltd., Ansan-si (KR); POSTECH ACADEMY-INDUSTRY FOUNDATION, Pohang-si (KR)

(72) Inventors: Jong Heo, Ansan-si (KR); Byoung Jin So, Ansan-si (KR); Seung Ryeol Lee, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 14/836,876

(22) Filed: Aug. 26, 2015

(65) Prior Publication Data

US 2015/0364658 A1   Dec. 17, 2015

Related U.S. Application Data

(63) Continuation-in-part of application No. PCT/KR2014/001501, filed on Feb. 25, 2014.

(30) Foreign Application Priority Data

Feb. 26, 2013   (KR) ................. 10-2013-0020754

(51) Int. Cl.
*H01L 21/00*      (2006.01)
*H01L 31/0336*   (2006.01)
(Continued)

(52) U.S. Cl.
CPC ............ *H01L 33/502* (2013.01); *C03B 19/06* (2013.01); *C03B 19/063* (2013.01);
(Continued)

(58) Field of Classification Search
CPC ..... H01L 33/502; H01L 33/50; H01L 33/501; H01L 2933/0041; H01L 2924/01067; H01L 2924/01068; H01L 33/26; H01L 33/325
(Continued)

(56) References Cited

U.S. PATENT DOCUMENTS 4,550,256 A    10/1985  Berkstresser et al.
7,872,410 B2 *  1/2011  Tasumi ............... G02B 6/0023
                                                    313/503
(Continued)

FOREIGN PATENT DOCUMENTS

JP          401208361      *   8/1989

OTHER PUBLICATIONS

Korean Intellectual Property Office, International Search Report, International Application No. PCT/KR2014/001501, Jun. 9, 2014, 4 pages.
(Continued)

*Primary Examiner* — Hsien Ming Lee
(74) *Attorney, Agent, or Firm* — Perkins Coie LLP

(57) ABSTRACT

A method of manufacturing a glass-phosphor composite is disclosed. The method comprises: preparing rare earth ion-containing parent glass; mixing the rare-earth ion-containing parent glass in a power state with a phosphor in a powder state; and providing a glass-phosphor composite using the powder mixture of the rare earth ion-containing parent glass and the phosphor, wherein the mixing includes mixing the rare earth ion-containing parent glass in the powder state with the phosphor in the powder state so that the phosphor in the glass-phosphor composite is in an amount of 5 wt % to 30 wt %, and the preparing includes using a glass frit having a glass transition point of 300° C. to 800° C. and a sintering temperature of 200° C. to 600° C.

21 Claims, 3 Drawing Sheets

(51) Int. Cl.
| | |
|---|---|
| *H01L 31/072* | (2012.01) |
| *H01L 33/50* | (2010.01) |
| *C09K 11/77* | (2006.01) |
| *C03B 19/06* | (2006.01) |
| *C03C 14/00* | (2006.01) |

(52) U.S. Cl.
CPC .......... *C03C 14/006* (2013.01); *C03C 14/008* (2013.01); *C09K 11/7706* (2013.01); *C09K 11/7766* (2013.01); *C09K 11/7774* (2013.01); *H01L 33/501* (2013.01); *H01L 33/505* (2013.01); *C03C 2214/16* (2013.01); *C03C 2214/17* (2013.01); *C03C 2214/30* (2013.01); *H01L 2933/0041* (2013.01)

(58) Field of Classification Search
USPC ........ 438/22, 28, 29, 48; 257/13, 21, 79, 80, 257/89, 290, 294
See application file for complete search history.

(56) References Cited

U.S. PATENT DOCUMENTS

| | | | |
|---|---|---|---|
| 7,989,236 | B2 | 8/2011 | Yamaguchi et al. |
| 9,062,853 | B2* | 6/2015 | Fuchi .................... H01L 33/504 |
| 2004/0212302 | A1 | 10/2004 | Letz et al. |
| 2007/0164308 | A1* | 7/2007 | Yoshimura ............ C04B 35/584 257/103 |
| 2012/0107622 | A1 | 5/2012 | Borrelli et al. |

OTHER PUBLICATIONS

Heo, Jong et al., "Glass matrices containing rare-earth ions for white light-emitting diodes with high color rendering indices", The Electrochemical Society, 2012, abstract.

Lee, Yi Kwon et al., "Phosphor in glass with Pb-free silicate glass powders as robust color-converting materials for white LED applications", Optics Letters, 2012, vol. 37, No. 15, pp. 3276-3278.

Yi, Seung Ryeol et al., "Stable and color-tailorable white light from blue LEDs using color-converting phosphor glass composites", Journal of the American Ceramic Society, Dec. 23, 2013, vol. 97, No. 2, pp. 342-345.

* cited by examiner

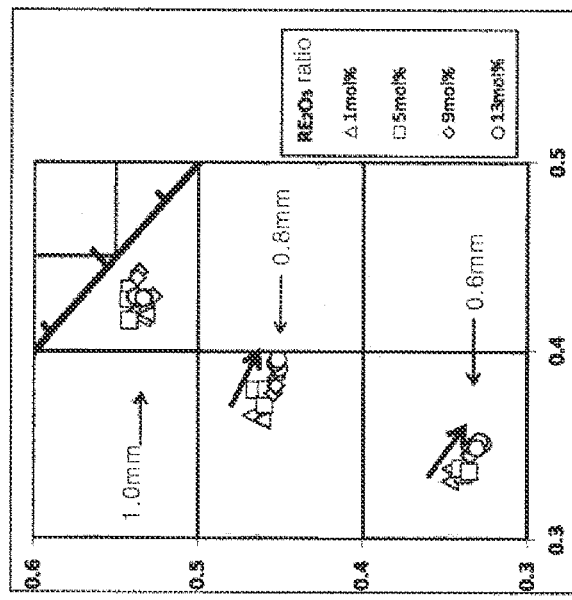
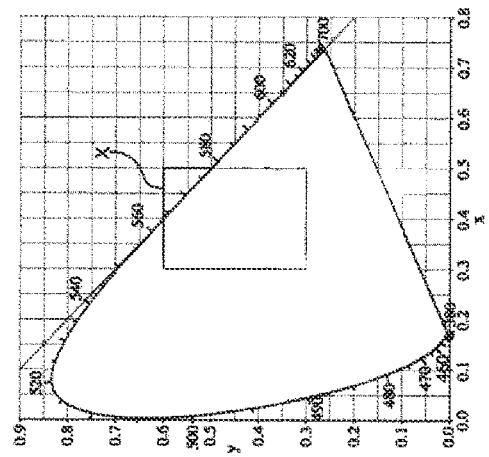
Fig. 5a
Fig. 5b

“GLASS-PHOSPHOR COMPOSITE CONTAINING RARE-EARTH ION AND LIGHT-EMITTING DIODE INCLUDING SAME”

CROSS-REFERENCE TO RELATED APPLICATION

This patent document is a continuation-in-part application of, and claims priority and benefits of, Patent Cooperation Treaty (PCT) application number PCT/KR2014/001501, entitled "GLASS-PHOSPHOR COMPOSITE CONTAINING RARE-EARTH ION AND LIGHT-EMITTING DIODE INCLUDING SAME", filed with the Korean Intellectual Property Office (KIPO) on Feb. 25, 2014, which further claims priority and the benefits of Korean Patent Application No. 10-2013-0020754 filed on Feb. 26, 2013. The entire disclosures of the above applications are incorporated by reference as part of this document.

TECHNICAL FIELD

The technology disclosed in this patent document relates to a technique for manufacturing a light emitting diode. Some implementations of the disclosed technology relate to a rare earth ion-containing glass-phosphor composite and a technique for manufacturing the glass-phosphor composite.

BACKGROUND

White light emitting diodes (LEDs) developed as devices for illumination are realized by combination of the three primary colors of light, and generally employ combination of a blue LED chip and yellow phosphors. The yellow phosphors representatively include Ce-containing yttrium aluminum garnet (YAG)-based phosphors, and various phosphors such as terbium aluminum garnet (TAG)-based, silicate-based, and nitride-based phosphors are being developed and used as the yellow phosphors. In addition, to improve color reproducibility of the white light emitting diodes, a method for combining red and green phosphors is also being developed.

However, since the YAG-based phosphors used from the earliest stage among phosphor materials for white LEDs have various merits such as material stability, high photo-conversion efficiency and the like, the YAG-based phosphors are used for most of white LED products which are currently commercially available. Such phosphors are used in a powder form and are mixed with an epoxy or silicone binder and then coated onto an upper side of a blue LED. The white LEDs are used for LCD backlights, auxiliary illumination, various pilot lamps and the like, and white LEDs for main illumination are also developed and commercially available.

Although the YAG phosphors used for white LEDs for illumination have a merit of long lifespan due to high fluorescence efficiency and stable bonding structure thereof, a spectrum of yellow light converted and emitted by the YAG phosphors absorbing blue light exhibits color imbalance in which a red light band is weaker than a green light band. Thus, when the white LEDs are realized by combination of the YAG phosphors and a blue LED chip, bluish white light, that is, cold white light having a high color temperature is realized. Due to overall color ratio imbalance, when the white LEDs are used as an illumination device, the white LEDs exhibit deterioration in color reproducibility, thereby deteriorating reliability of the illumination device. Although this phenomenon occurs due to inherent properties of the phosphors regardless of the kinds of phosphor supporting materials, it is easy to adjust optical properties of the white LEDs by modifying a composition of a glass material when the glass material is used as a phosphor binder.

SUMMARY

Various implementations of the disclosed technology provide a rare earth ion-containing glass-phosphor composite and a technique for manufacturing the glass-phosphor composite.

In one aspect, a method for manufacturing a glass-phosphor composite is provided to include: preparing rare earth ion-containing parent glass; mixing the rare earth ion-containing parent glass in a powder state with a phosphor in a powder state; and providing a glass-phosphor composite using the powder mixture of the rare earth ion-containing parent glass and the phosphor, wherein the mixing includes mixing the rare earth ion-containing parent glass in the powder state with the phosphor in the powder state so that the phosphor in the glass-phosphor composite is in an amount of 5 wt % to 30 wt %, and wherein the preparing includes using a glass frit having a glass transition point of 300° C. to 800° C. and a sintering temperature of 200° C. to 600° C.

In some implementations, the preparing the rare earth ion-containing parent glass includes mixing the glass frit in a powder state with a rare earth ion compound in a powder state, followed by melt-quenching.

In some implementations, the preparing of the rare earth ion-containing parent glass includes mixing the glass frit in a powder state with a rare earth ion compound in a powder state, followed by sintering.

In some implementations, the phosphor includes a phosphor material represented by a molecular formula of $(YA)_3(AlB)_5O_{12}:(RE)^{3+}$, wherein A includes lanthanides and at least one metal element of Tb, Sr, Ca, Ba, Mg or Zn, B includes at least one element of Si, B, P or Ga, and RE represents a lanthanide rare earth metal.

In some implementations, the phosphor includes a phosphor material represented by a molecular formula of $C_2SiO_4:(RE)^2$ or $C_3SiO_5:(RE)^{3+}$, wherein C includes at least one metal element of Mg, Ca, Sr or Ba, and RE represents a lanthanide rare earth metal.

In some implementations, the preparing of the rare earth ion-containing parent glass comprises using the glass frit comprising at least one of: a metal oxide including at least one of Pb, Bi, Ti or Ga; a glass forming element oxide including at least one of B, P, Si or Ge, or an alkali or alkali earth metal oxide.

In some implementations, the preparing of the rare earth ion-containing parent glass comprises adding a rare earth compound comprising a rare earth oxide, fluoride, sulfide, or halide including at least one of Ce, Pr, Sm, Eu, Tb, Dy, Ho, Er, Tm or Yb.

In some implementations, the preparing of the rare earth ion-containing parent glass includes mixing the glass frit in a powder state with the rare earth ion compound in a powder state, the rare earth ion compound having an mole percent of 0.05 mol % to 15 mol %.

In some implementations, the preparing of the rare earth ion-containing parent glass comprises using the glass frit having an index of refraction equal to or greater than that of the phosphor.

In some implementations, the providing of the glass-phosphor composite includes performing compression molding of a powder mixture formed from the mixing of the rare earth ion-containing parent glass and the phosphor, followed by heat treatment.

In another aspect, a glass-phosphor composite is provided to comprise: a rare earth ion-containing parent glass including a rare earth ion compound and glass frit; and a phosphor in an amount of 5 wt % to 30 wt % in the glass-phosphor composite, wherein the glass frit has an index of refraction equal to or greater than that of the phosphor.

In some implementations, the rare earth ion compound comprises a rare earth oxide, fluoride, sulfide, or halide comprising at least one of Ce, Pr, Sm, Eu, Tb, Dy, Ho, Er, Tm or Yb; and the glass frit comprises at least one of: a metal oxide comprising at least one of Pb, Bi, Ti, or Ga, a glass forming element oxide comprising at least one of B, P, Si or Ge, or an alkali or alkali earth metal oxide.

In another aspect, a light emitting device is provided to include: a substrate; an LED chip mounted over the substrate; and a glass-phosphor composite disposed at a position through which light emitted from the LED chip passes, wherein the glass-phosphor composite comprises a rare earth ion-containing parent glass including a rare earth ion compound and glass frit; and a phosphor in an amount of 5 wt % to 30 wt % in the glass-phosphor composite, wherein the glass frit has an index of refraction equal to or greater than that of the phosphor.

In some implementations, the rare earth ion compound in the rare earth ion-containing parent glass is configured to adjust color properties of the LED chip. In some implementations, the glass-phosphor composite has a hemispherical shape and is disposed over the substrate so as to surround the LED chip. In some implementations, the glass-phosphor composite is directly attached to an upper surface of the LED chip. In some implementations, the glass-phosphor composite has a sintering temperature of 200° C. to 600° C.

According to the some implementations of the disclosed technology, parent glass, in which rare earth ions are added to glass frit, is used as a glass carrier of a glass-phosphor composite, whereby fluorescence properties can be imparted to the glass carrier, and the same optical properties can be realized regardless of kinds and chemical properties of external base materials. The glass-phosphor composite using the glass carrier has a merit of securing mechanical, thermal and photochemical stability, as compared with existing composites using an organic carrier. In addition, the glass carrier can impart fluorescence properties to the carrier itself. Further, since the glass-phosphor composite exhibits less optical loss due to the phosphor, it is possible to achieve higher efficiency than existing composites in which two or more phosphors are mixed in an organic carrier.

BRIEF DESCRIPTION OF THE DRAWINGS

FIGS. 5a and 5b are graphs depicting color properties of white light that is obtained by use of a phosphor-containing glass specimen and a blue LED chip when the phosphor-containing glass specimen is formed using a rare earth ion-containing glass frit parent material.

DETAILED DESCRIPTION

Figure 1:
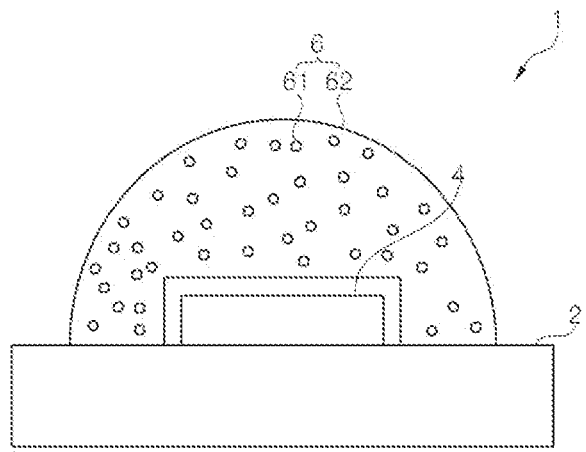
FIG. 1 is a sectional view of a white light emitting diode according to one embodiment of the disclosed technology.

Preparation of a phosphor-containing glass structures for LED devices, for example, a glass-phosphor composite, can be performed in various ways, including, e.g., precipitation, deposition, sintering or other suitable processes. Sintering is a method in which phosphor powder and glass frit powder are mixed and sintered. After fabrication of a sintered body including the phosphor powder and the glass frit powder, the thickness of the sintered body can be adjusted by polishing. This sintering-polishing process can be used to manufacture a glass-phosphor composite applicable to light emitting diodes, for example, white light emitting diodes. Such a glass-phosphor composite can be cut to a specific size and can be attached to an LED chip, for example, a blue LED chip. The above process can be complicated in part because the polishing process may cause loss of a material and thus should be carefully managed to reduce the material loss and the attachment process onto an LED chip is a separately performed process.

The disclosed technology in this patent document can be implemented in ways that address one or more technical issues in fabricating glass-phosphor composite structures. For example, some implementations of the disclosed technology provide a glass-phosphor composite for light emitting diodes to reduce the optical loss and increase the light output efficiency by imparting fluorescence properties to a glass carrier itself using rare earth ion-containing glass frits, and a light emitting diode including the glass-phosphor composite. Such implementations of the disclosed technology can benefit the fabrication of glass-phosphor composite structures missing two or more phosphors an organic carrier with reduced optical loss and improved efficiency.

Hereinafter, embodiments of the disclosed technology will be described in detail with reference to the accompanying drawings. It should be understood that the disclosed technology is not limited to the following embodiments and may be embodied in different ways, and that the embodiments are provided for facilitate the understanding of some implementations of the disclosed technology. In the drawings, the widths, lengths, thicknesses and the like of components may be exaggerated for convenience.

FIG. 1 is a sectional view of a white light emitting diode according to one embodiment of the disclosed technology. Referring to FIG. 1, a white light emitting diode 1 according to one embodiment of the disclosed technology includes a substrate 2, an LED chip 4 mounted on the substrate 2, and a glass-phosphor composite 6 disposed to transmit light of the LED chip 4.

The glass-phosphor composite 6 has a hemispherical shape and is attached to the substrate 2 to surround the LED chip 4. Alternatively, the glass-phosphor composite 6 may be directly attached to an upper surface of the LED chip 4. The substrate 2 may have a flat plate shape, or alternatively, may have a shape of a reflector in which a cavity receiving an LED chip is formed. Conductive patterns or lead terminals are formed on the substrate 2. In addition, the glass-phosphor composite 6 includes a phosphor material 61 such as $YAG:Ce^{3+}$, and the phosphor material is uniformly dispersed in a glass carrier 62. The glass carrier has fluorescence properties by addition of a rare earth ion thereto.

The LED chip may be or include a blue LED chip or a UV LED chip depending upon the kind of phosphor. For a blue LED chip, the glass-phosphor composite 6 includes a phosphor converting a portion of blue light into yellow light. For a UV LED chip, the glass-phosphor composite 6 includes a phosphor converting UV light into red, blue and green visible light. The glass-phosphor composite 6 may be attached to or separated from the LED chip 4. The glass-phosphor composite 6 is disposed at a position through which light emitted from the LED chip 4 passes.

Figure 2:
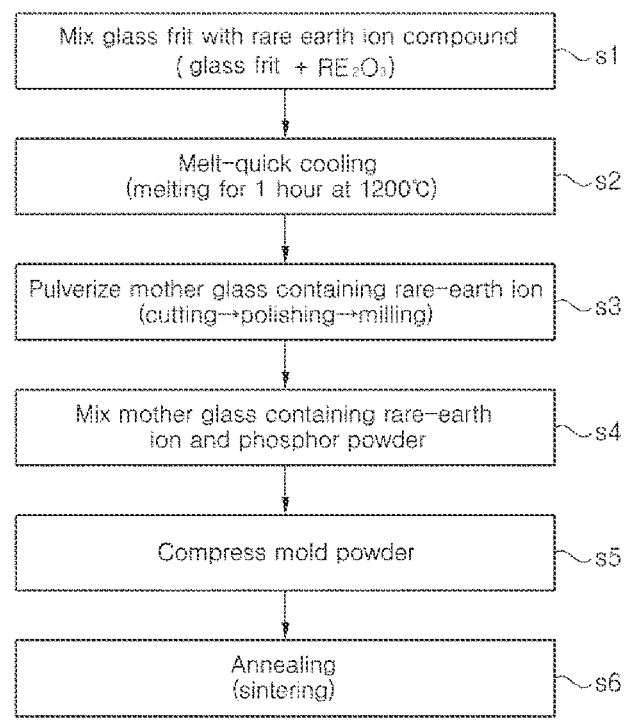
FIG. 2 is a flowchart of a method of manufacturing a rare earth ion-containing glass-phosphor composite.

FIG. 2 is a flowchart of a method of manufacturing a rare earth ion-containing glass-phosphor composite.

As shown in FIG. 2, a method for manufacturing a glass-phosphor composite includes: preparing rare earth ion-containing parent glass (S1 and S2); pulverizing the rare earth ion-containing parent glass and mixing the pulverized rare earth ion-containing parent glass with a phosphor in a powder state (S3 and S4); and manufacturing a glass-phosphor composite using the powder mixture (S5 and S6).

In preparing the rare earth ion-containing parent glass, a rare earth ion compound, for example, a parent material of the rare earth ion compound is mixed with glass frit powder (S1). A material which has a glass transition point of 300° C. to 800° C. and can be sintered at 200° C. to 600° C. is selected as a material for the glass frit powder. The material for the glass frit powder may be made of or include: an oxide of a metal element such as Pb, Bi, Ti, or Ga and the like; an oxide of a glass forming element such as B, P, Si, or Ge and the like; and an oxide of an alkali or alkali earth metal element such as Na, K, or Ca and the like. The rare earth ion compound may be composed of or include oxides, fluorides, sulfides or halides of rare earths such as Ce, Pr, Sm, Eu, Tb, Dy, Ho, Er, Tm, or Yb and the like. The rare earth ion compound may be added in an amount of 0.05 mol % to 15 mol %.

In one embodiment, 1 mol % to 13 mol % of the rare earth ion compound, for example, $RE_2O_3$ is added to and mixed with the glass frit powder.

Next, rare earth ion-containing parent glass is prepared through melt-quenching in which rare earth ion-containing oxide or fluoride-containing glass frit is melted and then quenched (S2). Alternatively, the rare earth ion-containing parent glass may also be prepared through sintering after the rare earth ion powder and the glass frit powder are mixed.

Figure 3:
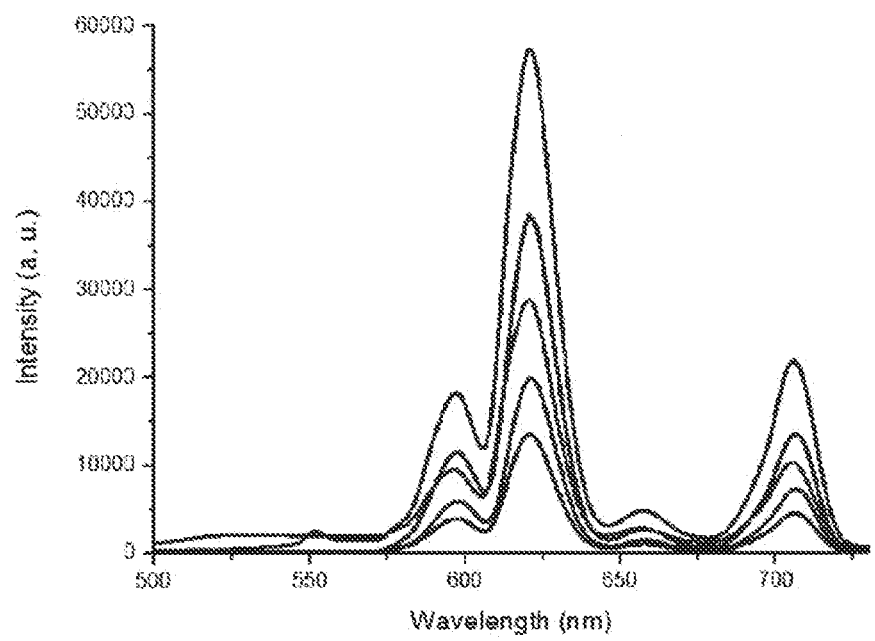
FIG. 3 shows a picture of rare earth ion-containing parent glass and a graph for explaining a fluorescence spectrum of rare earth ion-containing parent glass.

FIG. 3 shows a picture of rare earth ion-containing parent glass and a graph for explaining a fluorescence spectrum of rare earth ion-containing parent glass. Referring to FIG. 3, when the rare earth ion-containing parent glass is irradiated with blue LED light, red light can be observed by the naked eye and fluorescence peaks appear at about 590 nm, about 640 nm and 710 nm in a red light band.

The glass frit may be melted at a temperature of about 1200° C. for 1 hour.

Referring to FIG. 2 again, the rare earth ion-containing parent glass manufactured as described above is pulverized and thus formed into powder (S3). Next, the rare earth ion-containing parent glass powder is mixed with phosphor powder, thereby providing a powder mixture of the phosphor and the rare earth ion-containing parent glass (S4). In some implementations, ball milling may be used in the preparation of the powder mixture.

Here, a phosphor material having a molecular formula of $(YA)_3(AlB)_5O_{12}:(RE)^{3+}$ may be used. Here, A includes lanthanides and metal elements such as Tb, Sr, Ca, Ba, Mg, or Zn and the like, B includes elements such as Si, B, P, or Ga and the like, and RE represents a lanthanide rare earth metal. As another example, a phosphor material having a molecular formula of $C_2SiO_4:(RE)^{2+}$ or $C_3SiO_5:(RE)^{3+}$ may be used. Here, C includes metal elements such as Mg, Ca, Sr, or Ba and the like, and RE represents a lanthanide rare earth metal.

In some implementations, the phosphor material may have an index of refraction similar to or greater than that of the glass frit as set forth above.

After the phosphor-glass powder mixture is obtained, the powder mixture is subjected to compression molding, thereby manufacturing a compression powder molded specimen (hereinafter, referred to as a 'compression powder molded article') (S5). Next, the compression powder molded article is heat-treated, thereby manufacturing a rare earth ion-containing glass-phosphor composite specimen (S6).

The phosphor is present in an amount of 5% to 30% in the glass-phosphor composite based on the total volume of the glass-phosphor composite, and when the glass frit having a molar weight similar to that of the phosphor is used, the glass-phosphor composite contains 5 wt % to 30 wt % of the phosphor.

Figure 4:
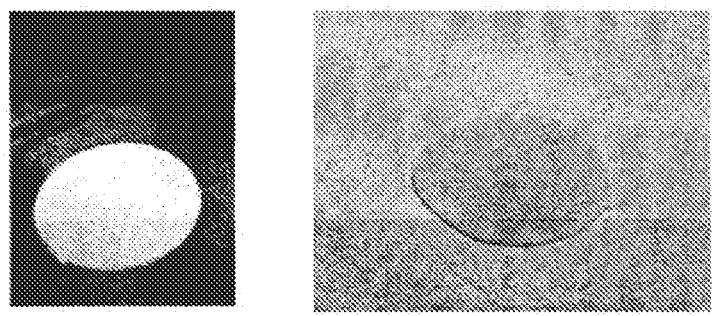
FIG. 4 is a picture of a compression specimen formed using a powder mixture of a phosphor and rare earth ion-containing glass and a picture of the specimen after heat treatment.

FIG. 4 shows a picture of a compression specimen formed using the powder mixture of a phosphor and rare earth ion-containing parent glass and a picture of the specimen after heat treatment. The thickness and size of the specimen after heat treatment are reduced as compared with the compression powder specimen, and the specimen after heat treatment is polished and then driven in combination with a blue LED, thereby realizing white light. A light emitting diode package and the phosphor-containing glass may be bonded using a method such as use of an organic resin, local heating, use of ceramic cement, and the like. In some implementations, the glass-phosphor composite may be formed into a flat plate shape as shown in FIG. 4. In some implementations, the glass-phosphor composite be formed into a hemispherical shape surrounding the LED chip.

FIGS. 5a and 5b are graphs depicting color properties of white light realized by use of a phosphor-containing glass specimen, for example, a glass-phosphor composite, which is manufactured using a rare earth ion-containing glass frit parent material, and a blue LED chip. Color coordinates of white light are shifted to a red band by increasing the amount of the phosphor in the glass frit. Based on this result, various rare earth ions may be added to the glass frit to adjust color properties of white light.

Some implementations of the disclosed technology provide a technique for adding rare earth ions to a parent glass material of a glass-phosphor composite that requires improvement in fluorescence and color properties. Higher product yield can be anticipated due to use of a simple process similar to a general process of preparing phosphor-containing glass, and an application range of a light emitting diode-based white light source can be expanded through improvement of color reproducibility from a light emitting diode and phosphors since the glass-phosphor composite allows accurate color adjustment as compared with single phosphor-containing glass.

What is claimed is:
1. A glass-phosphor composite comprising:
   a rare earth ion-containing parent glass including a rare earth ion compound and glass frit; and
   a phosphor in an amount of 5 wt % to 30 wt % in the glass-phosphor composite,
   wherein the glass frit has an index of refraction equal to or greater than that of the phosphor; and
   wherein the glass frit comprises an alkali or an alkali earth metal oxide and the phosphor comprises a phosphor material represented by a molecular formula of $(YA)_3(AlB)_5O_{12}:(RE)^{3+}$, wherein A comprises lanthanides and at least one metal element of Tb, Sr, Ca, Ba, Mg or Zn, B comprises at least one element of Si, B, P or Ga, and RE represents a lanthanide rare earth metal.

2. The glass-phosphor composite of claim 1, wherein: the rare earth ion compound comprises a rare earth oxide, fluoride, sulfide, or halide comprising at least one of Ce, Pr, Sm, Eu, Tb, Dy, Ho, Er, Tm or Yb.

3. A light emitting diode comprising:
a substrate;
an LED chip mounted over the substrate; and
a glass-phosphor composite disposed at a position through which light emitted from the LED chip passes, wherein the glass-phosphor composite comprises:
　　a rare earth ion-containing parent glass including a rare earth ion compound and glass frit; and
　　a phosphor in an amount of 5 wt % to 30 wt % in the glass-phosphor composite,
　　wherein the glass frit has an index of refraction equal to or greater than that of the phosphor; and
　　wherein the glass frit comprises an alkali or an alkali earth metal oxide and the phosphor comprises a phosphor material represented by a molecular formula of $C_2SiO_4$:$(RE)^{2+}$ or $C_3SiO_5$:$(RE)^{3+}$, wherein C comprises at least one metal element of Mg, Ca, Sr or Ba, and RE represents a lanthanide rare earth metal.

4. The light emitting diode of claim 3, wherein the rare earth ion compound in the rare earth ion-containing parent glass is configured to adjust color properties of the LED chip.

5. The light emitting diode according to claim 3, wherein the glass-phosphor composite has a hemispherical shape and is disposed over the substrate so as to surround the LED chip.

6. The light emitting diode according to claim 3, wherein the glass-phosphor composite is directly attached to an upper surface of the LED chip.

7. The light emitting diode according to claim 3, wherein the glass-phosphor composite has a sintering temperature of 200° C. to 600° C.

8. A method of manufacturing a glass-phosphor composite, comprising:
preparing rare earth ion-containing parent glass;
mixing the rare earth ion-containing parent glass in a powder state with a phosphor in a powder state; and
providing a glass-phosphor composite using the powder mixture of the rare earth ion-containing parent glass and the phosphor,
wherein the mixing includes mixing the rare earth ion-containing parent glass in the powder state with the phosphor in the powder state so that the phosphor in the glass-phosphor composite is in an amount of 5 wt % to 30 wt %, and
wherein the preparing includes using a glass frit having a glass transition point of 300° C. to 800° C. and a sintering temperature of 200° C. to 600° C., wherein the phosphor comprises a phosphor material represented by a molecular formula of $(YA)_3(AlB)_5O_{12}$:$(RE)^{3+}$, wherein A comprises lanthanides and at least one metal element of Tb, Sr, Ca, Ba, Mg or Zn, B comprises at least one element of Si, B, P or Ga, and RE represents a lanthanide rare earth metal.

9. The method according to claim 8, wherein the preparing of the rare earth ion-containing parent glass comprises mixing the glass frit in a powder state with a rare earth ion compound in a powder state, followed by sintering.

10. The method according to claim 8, wherein the preparing of the rare earth ion-containing parent glass comprises using the glass frit comprising at least one of:
a metal oxide comprising at least one of Pb, Bi, Ti or Ga;
a glass forming element oxide comprising at least one of B, P, Si, or Ge; or
an alkali or alkali earth metal oxide.

11. The method according to claim 8, wherein the preparing of the rare earth ion-containing parent glass comprises adding a rare earth compound comprising a rare earth oxide, fluoride, sulfide, or halide comprising at least one of Ce, Pr, Sm, Eu, Tb, Dy, Ho, Er, Tm or Yb.

12. The method according to claim 8, wherein the preparing of the rare earth ion-containing parent glass comprises mixing the glass frit in a powder state with a rare earth ion compound in a powder state, the rare earth ion compound having a mole percent of 0.05 mol % to 15 mol %.

13. The method according to claim 8, wherein the preparing of the rare earth ion-containing parent glass comprises using the glass frit having an index of refraction equal to or greater than that of the phosphor.

14. The method according to claim 8, wherein the providing of the glass-phosphor composite comprises performing compression molding of a mixture formed from the mixing of the rare earth ion-containing parent glass and the phosphor, followed by heat treatment.

15. A method of manufacturing a glass-phosphor composite, comprising:
preparing rare earth ion-containing parent glass;
mixing the rare earth ion-containing parent glass in a powder state with a phosphor in a powder state; and
providing a glass-phosphor composite using the powder mixture of the rare earth ion-containing parent glass and the phosphor,
wherein the mixing includes mixing the rare earth ion-containing parent glass in the powder state with the phosphor in the powder state so that the phosphor in the glass-phosphor composite is in an amount of 5 wt % to 30 wt %, and
wherein the preparing includes using a glass frit having a glass transition point of 300° C. to 800° C. and a sintering temperature of 200° C. to 600° C., wherein the phosphor comprises a phosphor material represented by a molecular formula of $C_2SiO_4$:$(RE)^{2+}$ or $C_3SiO_5$:$(RE)^{3+}$, wherein C comprises at least one metal element of Mg, Ca, Sr or Ba, and RE represents a lanthanide rare earth metal.

16. The method according to claim 15, wherein the preparing of the rare earth ion-containing parent glass comprises mixing the glass frit in a powder state with a rare earth ion compound in a powder state, followed by sintering.

17. The method according to claim 15, wherein the preparing of the rare earth ion-containing parent glass comprises using the glass frit comprising at least one of:
a metal oxide comprising at least one of Pb, Bi, Ti or Ga;
a glass forming element oxide comprising at least one of B, P, Si, or Ge; or
an alkali or alkali earth metal oxide.

18. The method according to claim 15, wherein the preparing of the rare earth ion-containing parent glass comprises adding a rare earth compound comprising a rare earth oxide, fluoride, sulfide, or halide comprising at least one of Ce, Pr, Sm, Eu, Tb, Dy, Ho, Er, Tm or Yb.

19. The method according to claim 15, wherein the preparing of the rare earth ion-containing parent glass comprises mixing the glass frit in a powder state with a rare earth ion compound in a powder state, the rare earth ion compound having a mole percent of 0.05 mol % to 15 mol %.

20. The method according to claim 15, wherein the preparing of the rare earth ion-containing parent glass comprises using the glass frit having an index of refraction equal to or greater than that of the phosphor.

21. The method according to claim 15, wherein the providing of the glass-phosphor composite comprises performing compression molding of a mixture formed from the mixing of the rare earth ion-containing parent glass and the phosphor, followed by heat treatment.

* * * * *